United States Patent
Inoue et al.

(10) Patent No.: US 7,061,452 B2
(45) Date of Patent: *Jun. 13, 2006

(54) SPONTANEOUS LIGHT-EMITTING DISPLAY DEVICE

(75) Inventors: Mitsuo Inoue, Tokyo (JP); Masashi Okabe, Tokyo (JP); Shuji Iwata, Tokyo (JP); Takashi Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 353 days.

This patent is subject to a terminal disclaimer.

(21) Appl. No.: 10/276,062

(22) PCT Filed: Mar. 15, 2002

(86) PCT No.: PCT/JP02/02493

§ 371 (c)(1),
(2), (4) Date: Nov. 12, 2002

(87) PCT Pub. No.: WO02/075711

PCT Pub. Date: Sep. 26, 2002

(65) Prior Publication Data

US 2003/0142047 A1 Jul. 31, 2003

(30) Foreign Application Priority Data

Mar. 19, 2001 (JP) ............................... 2001-77816

(51) Int. Cl.
*G09G 3/30* (2006.01)

(52) U.S. Cl. ........................ 345/76; 345/82; 345/207
(58) Field of Classification Search ................ 345/76, 345/77, 78, 81, 90, 204, 207; 315/169.3
See application file for complete search history.

(56) References Cited

U.S. PATENT DOCUMENTS

| | | | | |
|---|---|---|---|---|
| 5,838,308 A * | 11/1998 | Knapp et al. | ................ | 345/173 |
| 5,886,474 A | 3/1999 | Asai et al. | | |
| 6,392,617 B1 * | 5/2002 | Gleason | ........................ | 345/82 |
| 6,404,137 B1 | 6/2002 | Shodo | | |
| 6,424,326 B1 | 7/2002 | Yamazaki et al. | | |
| 6,452,341 B1 | 9/2002 | Yamauchi et al. | | |
| 6,518,962 B1 * | 2/2003 | Kimura et al. | ............... | 345/211 |
| 6,747,638 B1 * | 6/2004 | Yamazaki et al. | ........... | 345/207 |
| 6,812,651 B1 * | 11/2004 | Iwata et al. | ............... | 315/169.3 |
| 2002/0011972 A1 | 1/2002 | Yamazaki et al. | | |

FOREIGN PATENT DOCUMENTS

| | | |
|---|---|---|
| EP | 0 923 067 A1 | 6/1999 |
| JP | 2001-56667 | 2/2001 |
| JP | 2001-67018 | 3/2001 |
| JP | 2001-75524 | 3/2001 |
| JP | 2001-265283 | 9/2001 |
| JP | 2001-292276 | 10/2001 |

* cited by examiner

*Primary Examiner*—Xiao Wu
(74) *Attorney, Agent, or Firm*—Leydig, Voit & Mayer, Ltd.

(57) ABSTRACT

In a spontaneous light-emitting display device operating in an active matrix mode, variations in the threshold voltages of transistors controlling the current flowing to light-emitting elements and variations in the light emission threshold voltages of the light-emitting elements are suppressed, reducing variations in the luminance of the light-emitting elements. Light-detecting elements detect light emitted by the light-emitting elements, and threshold voltages of the transistors are detected by the voltages of nodes of resistors and the light-emitting elements. Further, transistors controlled by respective signals of the light-detecting elements also detect the light emission threshold voltages of the light-emitting elements.

11 Claims, 13 Drawing Sheets

SPONTANEOUS LIGHT-EMITTING DISPLAY DEVICE

TECHNICAL FIELD

The present invention relates to a luminance control of, in particular, a spontaneous light emitting element (for example, a spontaneous light emission light emitting element such as organic EL element) in a spontaneous light emitting display device including a matrix of light emitting elements, and aims to suppress fluctuation in luminance of the spontaneous light emitting element. The spontaneous light emitting element is simply described as light emitting element in the explanation below.

BACKGROUND ART

An organic EL display using an organic EL (a spontaneous light emitting type light emitting element) for a display panel has reached a practical level. Since the organic EL display has excellent features which cannot be obtained by a liquid crystal display, for example, spontaneous light emission, high-speed response and a wide angle of view, it has been widely expected to be a flat panel display which can produce clear characters, and graphic images, and a dynamic image display. The organic EL display can be classified into a passive matrix type (PM type) and an active matrix type (AM type) depending on driving method.

It is said that the PM type is provided with a driving circuit on the outside of an organic EL panel and the structure of the organic EL panel itself can be therefore simplified and cost can be reduced. At present, the PM type organic EL panel is manufactured as a product and is used for a vehicle or a mobile telephone. The organic EL is a current driving element. In order to eliminate variation in luminance of the organic EL panel, therefore, it is necessary to cause a current flowing to each light emitting pixel to achieve an equal magnitude. However, it is hard to have an equal current and to reduce power consumption due to the following problems (1) to (3).

(1) In order to cause luminance of all pixels to be uniform, the current flowing to each of the pixels is to be equal. For this reason, it is necessary to cause one of the positive and negative electrodes of each pixel to act as a constant current source. In order to operate the electrode as the constant current source, however, the driving voltage of a matrix electrode on the other side is to be increased such that a voltage drop caused by the resistance component of a bus line has no influence. Consequently, a power consumption is increased. In the case in which a driving voltage cannot be increased sufficiently, a voltage drop corresponding to a bus line length to reach each pixel influences a current amount for light emission. More specifically, the constant current source is not obtained so that a variation in luminance is caused.

(2) In order to obtain a predetermined surface luminance, the PM type needs to emit a light with an N-fold instantaneous luminance if the number of scanning lines of the display panel is N. Since a current flowing to the pixel is usually proportional to a light emission luminance, the current to flow becomes N-fold. Since the organic EL has such a feature that a light emission efficiency is reduced if a current to flow is increased, however, an N-fold pixel current or more is required for obtaining the predetermined surface luminance. Thus, the power consumption is increased if the number N of the scanning lines is increased. This problem increasingly promotes the problem (1).

(3) Since the organic EL panel has a surface structure, a capacitive load is connected to each element in parallel as an equivalent circuit. When a pixel current is increased or the number of pixels is increased so that a repetitive frequency is increased, the magnitude of a charging and discharging current to flow to the capacitive load is made great so that a power consumption is increased. Due to the problem (2), the power consumption of the capacitive load is considerably increased in the PM type.

Due to the above problem, the PM type which is currently manufactured as a product has a screen size of several inches or less and a pixel number of 10,000-pixel level.

In the AM type organic EL panel, the above problems can be alleviated.

In the above problem (1), the AM type has a TFT driving circuit provided in each pixel. Therefore, it is not necessary to cause a large current to flow instantaneously. As a result, a voltage drop caused by a bus line in the above problem A is decreased and an applied voltage can be reduced. Consequently, the power consumption can be reduced more considerably than that of the PM type. Since the applied voltage can be reduced, a slightly high applied voltage is simply set so that a voltage drop corresponding to a bus line length to each pixel does not influence on a pixel current amount. Consequently, an uniform luminance can be obtained.

In the above problem (2), the AM type has a TFT driving circuit provided in each pixel. Therefore, it is sufficient that a small pixel current always flows irrespective of the number N of the scanning lines. Therefore, there can be avoided increase of power consumption due to reduction in light emission efficiency with an increase in a pixel current. In the problem (3), since the AM type has the TFT driving circuit provided in each pixel, it is sufficient that a small pixel current flows irrespective of the number N of the scanning lines. Therefore, a charging and discharging current flowing to the capacitive load can be reduced. Consequently, the power consumption can be reduced. Thus, the AM type organic EL panel can reduce a variation in luminance and a power consumption.

However, the AM type has the following great drawback. More specifically, it is hard to fabricate a driving element having a uniform characteristic over the whole organic EL panel area. As a result, a current value flowing to each pixel is different so that a luminance is varied.

FIG. 7 shows a pixel driving circuit for causing a pixel in a conventional AM type organic EL panel to emit a light which has been described in Japanese Patent Publication No. 2784615, for example.

An operation of the pixel driving circuit will be described below with reference to FIG. 7.

A first transistor 53 is, for example, a FET constituted by an N channel type and is operated as a switching element. A second transistor 55 is, for example, an FET constituted by a P channel and is operated as a driving element. A capacitor 54 is a capacitive load connected to the drain terminal of the first transistor 53. An organic EL element 56 is connected to the drain terminal of the second transistor 54. The drain terminal of the first transistor 53 is connected to the gate terminal of the second transistor 55. A scanning signal is applied from a first vertical scanning line 51 to the gate terminal of the first transistor 53. An image signal is applied from a first horizontal scanning line 52 to the source terminal. Reference numeral 57 denotes a power source line.

Next, light emitting mode is explained. First of all, a scanning signal is applied to the gate terminal of the first transistor 53. At this time, when an image signal is applied at a predetermined voltage to the source terminal of the first transistor 53, the capacitor 54 connected to the drain terminal of the first transistor 53 is held to have a voltage level V1 corresponding to the magnitude of an image signal. If the magnitude of the voltage level V1 held to have the gate voltage of the second transistor 55 is enough for causing a drain current to flow, a current corresponding to the magnitude of the voltage level V1 flows to the drain of the second transistor 55. The drain current becomes a light emitting current for the organic EL element 56. The luminance is proportional to the magnitude of the light emitting current.

FIG. 8 is a characteristic chart for explaining the generation of a luminance variation in a pixel when a light emission is carried out by such an operation. The characteristic chart shows the relationship between a gate-source voltage and a drain current of the second transistor 55. In the case in which the first transistor 53 and the second transistor 55 are formed of the low temperature polysilicon, it is hard to obtain an FET having the same characteristic over the whole display panel area in respect of manufacturing method of a low temperature polysilicon. For example, each of the first transistor 53 and the second transistor 55 has a variation in characteristic shown in FIG. 13. When the voltage level V1 is applied to the second transistor 55 having such a characteristic, the magnitude of the drain current is varied in a range of Ia to Ib. Since the organic EL emits a light with a luminance which is proportional to the magnitude of the current, the characteristic of the second transistor 55 represents a variation in light emission luminance. In particular, the variation in characteristic shown in FIG. 8 cannot prevent the generation of the luminance variation in a method of modulating a luminance in an analog amount, that is, a method of controlling a light emission luminance with the magnitude of the voltage level V1.

In a digital luminance control method for controlling a luminance at a level in which the voltage level V1 shown in FIG. 9 always has a constant value, therefore, a level in which a current is saturated is used. Consequently, it is possible to prevent a luminance variation generated in an analog luminance control method. In the case of a characteristic having the relationship between the gate-source voltage and the drain current of the second transistor 55 shown in FIG. 10, however, a saturation current is not equal. Also in the digital luminance control method, therefore, a luminance variation is generated. Thus, it is difficult to prevent the luminance variation by the characteristic variation of a driving element in the conventional driving circuit. FIG. 11 shows a pixel driving circuit described in "Active Matrix OELD Displays with Po—SiTFT. The 10th International Workshop on Inorganic & OEL. P. 347 to P. 356" as a conventional example in which the characteristic variation of the driving element is improved. In this conventional example, the second transistors 55A, 55B to be driving elements are connected in parallel with each other to average the characteristic variation.

Moreover, there has been proposed a circuit for automatically correcting a characteristic variation in a driving element. FIG. 11 shows an automatic correcting circuit for a driving element characteristic variation provided in a pixel which has been illustrated in {R. Dawson. et al. : Proc. of SID' 99 (1999) P.438}. In the present circuit, two transistors are used in addition to a first transistor and a second transistor, thereby correcting the characteristic variation in the driving element.

With reference to FIG. 12, the operation of the present circuit will be described. First of all, a first vertical scanning line 51 is activated so that a first transistor 53 is conducted and a signal for sufficiently conducting a second transistor 55 is input from a first horizontal scanning line 52 through the first transistor 53 and an auxiliary capacitor 553. At this time, a transistor 555 for organic EL element connection which is to be controlled by a vertical scanning line 552 for organic EL element connection is conducted and a current flows to an organic EL element 56 by a current sent from a power line 57. Next, when the vertical scanning line 552 for organic EL element connection is deactivated and a vertical scanning line 551 for correction is activated, the current of the organic EL element 56 is stopped, while the closed circuit of a capacitor 54, the second transistor 55 and a transistor 554 for correction is formed and the voltage of the capacitor 54, that is, the gate-source voltage of the second transistor 55 is gradually dropped. When the voltage reaches the threshold voltage of the second transistor 55, the second transistor 55 becomes non-conductive so that the closed circuit is opened. Accordingly, an electric potential corresponding to the threshold voltage is stored in the capacitor 54. Next, the transistor 554 for correction is non-conducted by the vertical scanning line 551 for correction to activate the vertical scanning line 552 for organic EL element connection so that the transistor 555 for organic EL element connection is brought into a conduction state. Then, a data signal corresponding to a luminance required for the organic EL element 56 is sent by the first horizontal scanning line 52. Consequently, a specified luminance can be realized. In the present circuit, the threshold voltage of the second transistor 55 is stored in the capacitor 54 in a pixel, thereby correcting a variation in a threshold to reduce a variation in a luminance.

The conventional spontaneous light emitting type display device is constituted as described above. Therefore, there is a problem that a voltage to be applied to the organic EL element is varied in the case in which the threshold voltage of a transistor to be a driving element is varied, and a luminance is varied in each pixel in the case in which display is carried out in the same gradation.

On the other hand, the variation in the threshold voltage of the transistor is canceled in order to suppress the variation in the luminance. As in the structure shown in FIG. 12, therefore, in a spontaneous light emitting type display device using four transistors in one pixel, a variation in the threshold of the transistor can be suppressed. However, an organic EL element has a luminance-element applied voltage characteristic shown in FIG. 13, for example, characteristics A, B and C depending on a variation in a light emission threshold voltage. When the same voltage Vs is applied to carry out the display in the same gradation, the luminance of each pixel generates a variation in values indicated as Bo, Ba and Bb depending on a difference in the light emission threshold voltage. Consequently, it is impossible to suppress the variation in the luminance caused by a variation in the characteristic of the organic EL element itself.

DISCLOSURE OF INVENTION

A spontaneous light emitting type display device according to a first structure of the present invention includes a plurality of light emitting elements arranged in a matrix, and at least one photo-detecting element provided for each light emitting element and formed to receive light emitted from the light emitting element, wherein an amount of the light emission of the light emitting element is controlled in response to a signal of the photo-detecting element.

According to the structure, it is possible to correct the threshold voltage of a transistor, thereby suppressing a variation in a luminance.

A spontaneous light emitting type display device according to a second structure of the present invention includes a plurality of first vertical scanning lines and a plurality of first horizontal scanning lines, a plurality of horizontal scanning lines and a plurality of power lines provided orthogonally to the first vertical scanning lines, a first transistor provided in the vicinity of an intersection of the first vertical scanning line and the first horizontal scanning line and controlled by the first vertical scanning line, a capacitor connected to the first horizontal scanning line through the first transistor, a second transistor connected to the first horizontal scanning line through the first transistor and controlled by the first horizontal scanning line, and a light emitting element connected to the power line through the second transistor and arranged in a matrix, wherein a photo-detecting element and a resistor are connected between the first vertical scanning line and the power line in series, a third transistor controlled to have an electric potential of a node of the photo-detecting element and the resistor is provided, the power line is connected to a second horizontal scanning line through the third transistor and the photo-detecting element receives light emitted from the light emitting element.

According to the structure, it is possible to detect a variation in the threshold voltage of the transistor with a simple circuit.

A spontaneous light emitting type display device according to a third structure of the present invention includes, in the spontaneous light emitting type display device according to the second structure, a control circuit for reading a signal of a light receiving element through the second horizontal scanning line, a memory for storing a signal for each light emitting element as data, and means for modulating a signal voltage to be applied to the light emitting element based on the data of the memory and applying the signal voltage thus modulated to the first horizontal scanning line.

According to the structure, it is possible to modulate the signal voltage to be applied to the light emitting element based on the data of the memory, thereby suppressing a variation in a luminance.

A spontaneous light emitting type display device according to a fourth structure of the present invention includes a plurality of first vertical scanning lines and a plurality of first horizontal scanning lines, a first transistor provided in the vicinity of an intersection between the first vertical scanning line and the first horizontal scanning line and controlled by the first vertical scanning line, a capacitor connected to the first horizontal scanning line through the first transistor, a second transistor connected to the first horizontal scanning line through the first transistor and controlled by the first horizontal scanning line, a light emitting element connected to a power line through the second transistor and arranged in a matrix, and a fourth transistor controlled by the first vertical scanning line, wherein a photo-detecting element and the capacitor are connected between the first vertical scanning line and the power line in series, a node of the photo-detecting element and the capacitor is connected to a second horizontal scanning line through the fourth transistor, and the photo-detecting element receives light from the light emitting element.

According to the structure, it is possible to suppress a direct current and to detect a variation in the threshold voltage of the transistor while reducing power consumption.

A spontaneous light emitting type display device according to a fifth structure of the present invention includes, in the spontaneous light emission type display device according to the fourth structure of the present invention, a control circuit for reading a signal of the photo-detecting element through the second horizontal scanning line, a memory for storing a signal for each light emitting element as data, and means for modulating a signal voltage to be applied to the light emitting element based on the data of the memory and applying the signal voltage thus modulated to the first horizontal scanning line.

According to the structure, it is possible to modulate the signal voltage to be applied to the light emitting element based on the data of the memory and to suppress a variation in luminance while reducing power consumption.

A spontaneous light emitting type display device according to a sixth structure of the present invention includes a plurality of first vertical scanning lines and a plurality of first horizontal scanning lines, a first transistor provided in the vicinity of an intersection of the first vertical scanning line and the first horizontal scanning line and controlled by the first vertical scanning line, a capacitor connected to the first horizontal scanning line through the first transistor and a second capacitor, a second transistor connected to the first horizontal scanning line through the first transistor and the second capacitor and controlled by the first horizontal scanning line, a plurality of light emitting elements connected to a power line through the second transistor and arranged in a matrix, and a fifth transistor controlled by a second vertical scanning line and provided between a control line of the second transistor and the light emitting element, wherein a sixth transistor is provided between the control line of the second transistor and the light emitting element in series to the fifth transistor, a photo-detecting element and a resistor are connected between the second vertical scanning line and the power line in series, a node of the photo-detecting element and the resistor is connected to a control line of the sixth transistor, and the photo-detecting element receives light from the light emitting element.

According to the structure, the light emission threshold voltage of the light emitting element is detected. Therefore, it is possible to correct, in a pixel, a variation in the threshold voltage of the transistor and a variation in the light emission threshold voltage of the light emitting element, thereby suppressing a variation in luminance.

A spontaneous light emitting type display device according to a seventh structure of the present invention is characterized, in the spontaneous light emitting type display device according to the first structure of the present invention, in that the photo-detecting element is formed of amorphous silicon.

According to the structure, the photo-detecting element can be formed in a simple process. Consequently, it is possible to implement a spontaneous light emitting type display device having a small variation in luminance at a low cost.

A spontaneous light emitting type display device according to an eighth structure of the present invention is characterized, in the spontaneous light emitting type display device according to the second or sixth structure of the present invention, in that both the photo-detecting element and the resistor are formed of amorphous silicon and a shielding film is formed between the amorphous silicon constituting the resistor and the amorphous silicon constituting the light emitting element.

According to the structure, it is possible to implement a spontaneous light emitting type display device having a small variation in luminance at a low cost.

BEST MODE OF CARRYING OUT THE INVENTION

Figure 1:
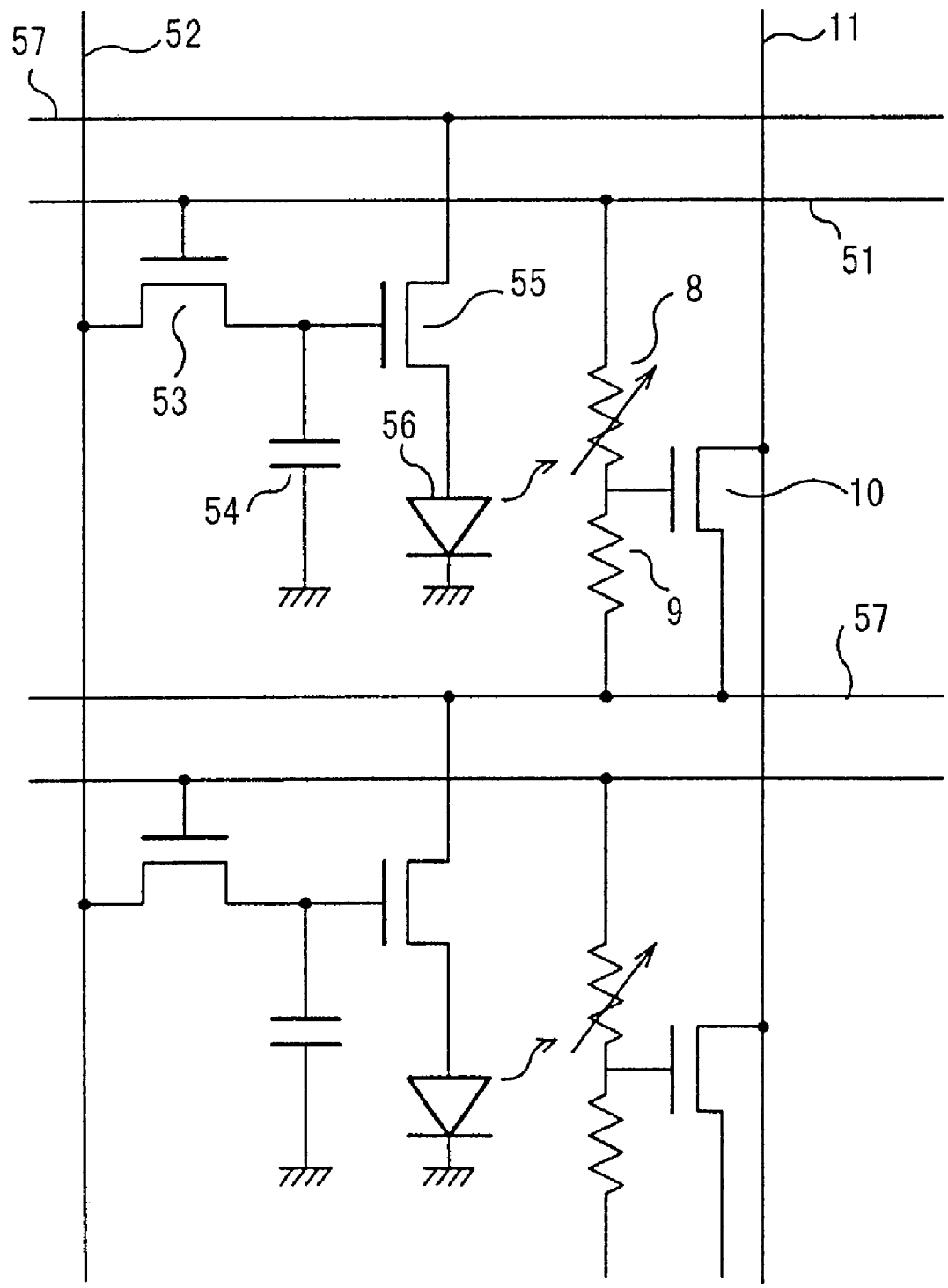
FIG. 1 is a circuit diagram showing the structure of a pixel driving circuit according to Embodiment 1 of the present invention.

Embodiments of the present invention will be described below with reference to the drawings. In the drawings, the same reference numerals denote the same or corresponding portions.

Embodiment 1

FIG. 1 is a circuit diagram showing a pixel driving circuit (an upper half of FIG. 1) corresponding to one pixel of a spontaneous light emitting type display device according to Embodiment 1 of the present invention. In FIG. 1, 51 denotes a first vertical scanning line, 52 denotes a first horizontal scanning line, 53 denotes a first transistor, 54 denotes a capacitor, 55 denotes a second transistor, and 56 denotes a light emitting element which is formed of an organic EL element. While one of the ends of the capacitor 54 and the cathode side of the organic EL element 56 are grounded, it is preferable that they should have a fixed potential. 57 denotes a power line. Moreover, 8 denotes a photo-detecting element and 9 denotes a resistor. The photo-detecting element 8 and the resistor 9 are connected between the first vertical scanning line 51 and the first vertical scanning line 57 in a next stage in series to each other. 10 denotes a third transistor having a gate connected to a node of the photo-detecting element 8 and the resistor 9, and 11 denotes a second horizontal scanning line. The drain of the third transistor 10 is connected to the second horizontal scanning line 11. Since the structure of a lower half in the drawing is the structure in the next stage and is the same as that of an upper half, description thereof will be omitted. Moreover, since the pixel driving circuit is arranged in a matrix and the structure is the same as that in the conventional art, description thereof will be omitted.

Next, an operation will be described.

When the first vertical scanning line 51 is activated, the first transistor 53 is brought into a conduction state so that the voltage of the first horizontal scanning line 52 is charged into the character 54 through the first transistor. At the same time, the voltage charged into the capacitor 54 is connected to the gate of the second transistor 55. Consequently, the second transistor 55 is brought into the conduction state so that a current is supplied from the power line 57 to the organic EL element 56 and the organic EL element 56 emits light. An amount of light emission is controlled by a voltage value applied to the gate of the second transistor 55, and furthermore, a voltage thereof is maintained by the capacitor 54 and the organic EL element 56 continuously emits light also after the first vertical scanning line 51 is deactivated and the first transistor 53 is set into a non-conduction state as described above.

A current flowing to the organic EL element 56 is controlled by a voltage value applied to the gate of the second transistor 55, and a current value Id and a voltage value Vg applied to the gate of the second transistor 55 have the relationship shown in an equation (1).

$$Id = k \times Vd \times (Vg - Vth) \tag{1}$$

Here, Vd represents a voltage to be applied between the source and the drain of the transistor, Vth represents a threshold voltage of the transistor, and k represents a constant determined by a channel length, a channel width and a carrier mobility in the second transistor 55. More specifically, the current value Id of the second transistor 55 is determined by a difference in the threshold voltage Vth of the transistor from the gate voltage Vg of the second transistor 55. Since Vth has a great variation for each transistor, the same luminance cannot be obtained even if the same Vg is applied as described above.

In Embodiment 1, the light of the organic EL element 56 can be detected by the photo-detecting element 8. When the first vertical scanning line 51 is activated, a voltage between the power line 57 and the first vertical scanning line 51 is applied to the photo-detecting element 8 and the resistor 9. At the same time, a voltage corresponding to luminance data is applied to the first horizontal scanning line 52 and the organic EL element 56 emits light, and the resistance value of the photo-detecting element 8 is rapidly reduced and the voltage of the node of the photo-detecting element 8 and the resistor 9 approaches the voltage of the first vertical scanning line 51 by the light emission. Since the node is connected to the gate of the third transistor 10, the third transistor 10 is conducted by the voltage, the second horizontal scanning line 11 is connected to the power line 57 through the third transistor 10 and the electric potential of the second horizontal scanning line 11 becomes almost equal to that of the power line 57. By observing the electric potential of the second horizontal scanning line, consequently, it is possible to detect that the organic EL element 56 corresponding to the activated first vertical scanning line 51 emits light.

More specifically, a voltage at which the organic EL element 56 starts to emit light becomes clear by sequentially changing the voltage data of the first horizontal scanning line 52, for example, raising a voltage stepwise.

Figure 2:
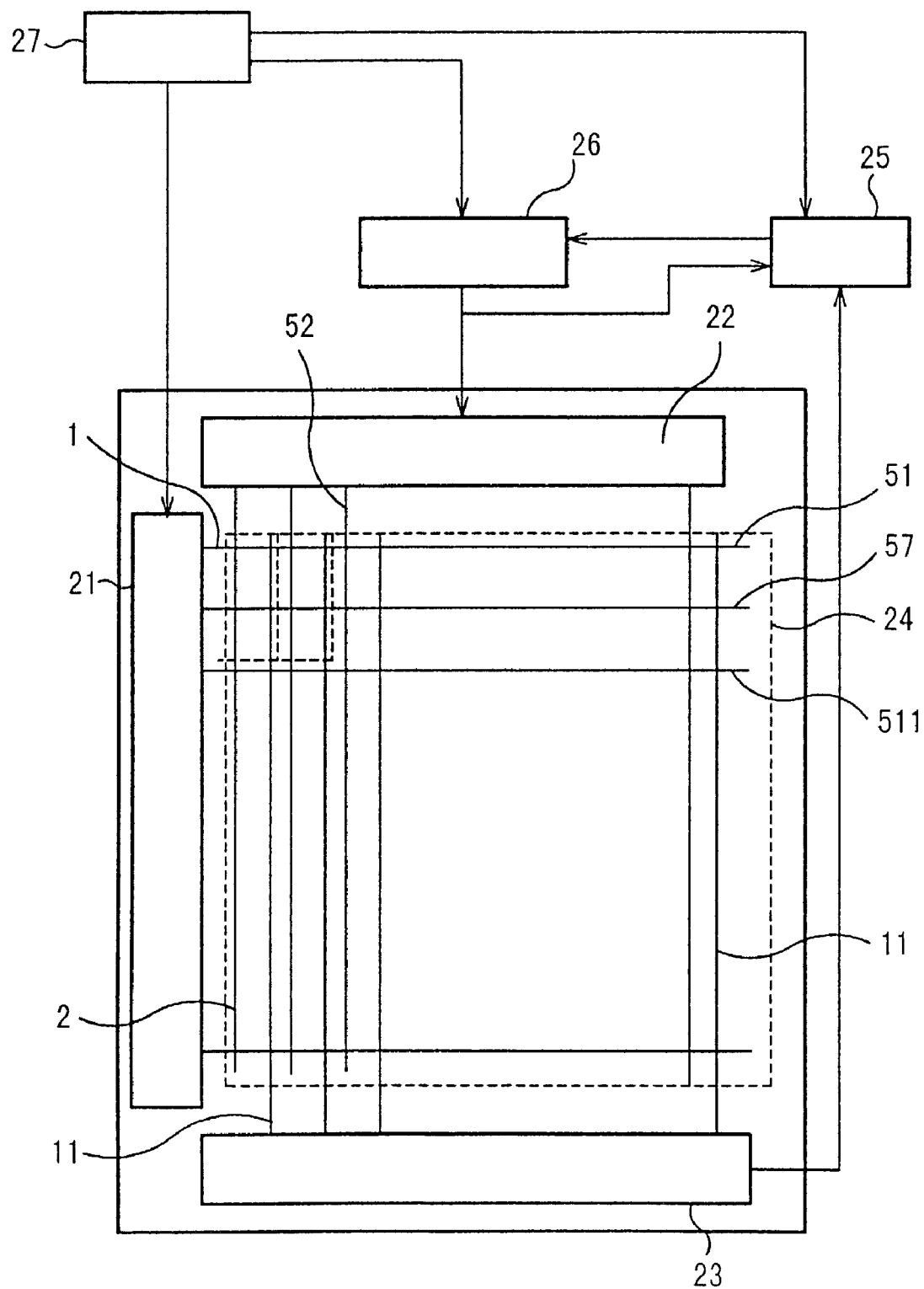
FIG. 2 is a conceptual view showing the schematic structure of the control circuit of a spontaneous light emitting display device according to Embodiment 1 of the present invention.

FIG. 2 shows the control circuit of the spontaneous light emitting type display device according to Embodiment 1. In FIG. 2, 21 denotes a vertical scanning circuit for controlling the first vertical scanning line 51 based on a vertical scanning line signal sent from a control circuit 27 (which will be described below), 22 denotes a first horizontal scanning circuit for controlling the first horizontal scanning line 52, 23 denotes a second horizontal scanning circuit for controlling the second horizontal scanning line 11, 24 denotes a display portion in which a large number of pixels including the organic EL element 56 and the photo-detecting element 8 are formed in a matrix, 25 denotes a memory for storing, as data, the voltage of the first horizontal scanning line 52 (a first horizontal scanning line signal) in the address of a predetermined pixel at the time of detection of the photo-detecting element 8, 26 denotes a voltage converting circuit for converting a voltage to be applied to the first horizontal scanning line 52 based on the data of the memory 25, and 27 denotes a control circuit for transmitting a vertical synchronization signal to the vertical scanning circuit 21, luminance data to the voltage converting circuit 26, and data on the address of a pixel to the memory 25, respectively. In the voltage converting circuit 26, more specifically, a voltage at which each pixel stored in the memory 25 starts to emit light is added to a voltage corresponding to a luminance to illuminate the pixel, and luminance data on each of gradations other than a minimum gradation are modulated into signal voltage data by the voltage converting circuit 26 corresponding to the minimum gradation of the luminance data sent from the control circuit 27, and the signal voltage data thus modulated are applied to the first horizontal scanning line 22.

A main operation will be described.

When the light emission of the organic EL element 56 is detected by the photo-detecting element 8, the electric potential signal of the second horizontal scanning line 11 is sent as a light emission timing signal to the memory 25 and the voltage signal of the first horizontal scanning line 52 at the time of detection of the photo-detecting element 8 is sent to the memory 25. In the memory 25, the voltage signal of the first horizontal scanning line 52 is stored in the memory 25 based on the timing signal in relation to data on the address of a pixel corresponding to the organic EL 56 which are transmitted from the control circuit 27. The voltage signal of the first horizontal scanning line 52 is stored for each pixel in each row in the memory 25, and similarly, is stored for each pixel in each column. The storage operation of the memory 25 is carried out continuously until scanning is performed by the first vertical scanning line 51 as a next frame. In the next frame, the above operation is repeated.

Figure 3:
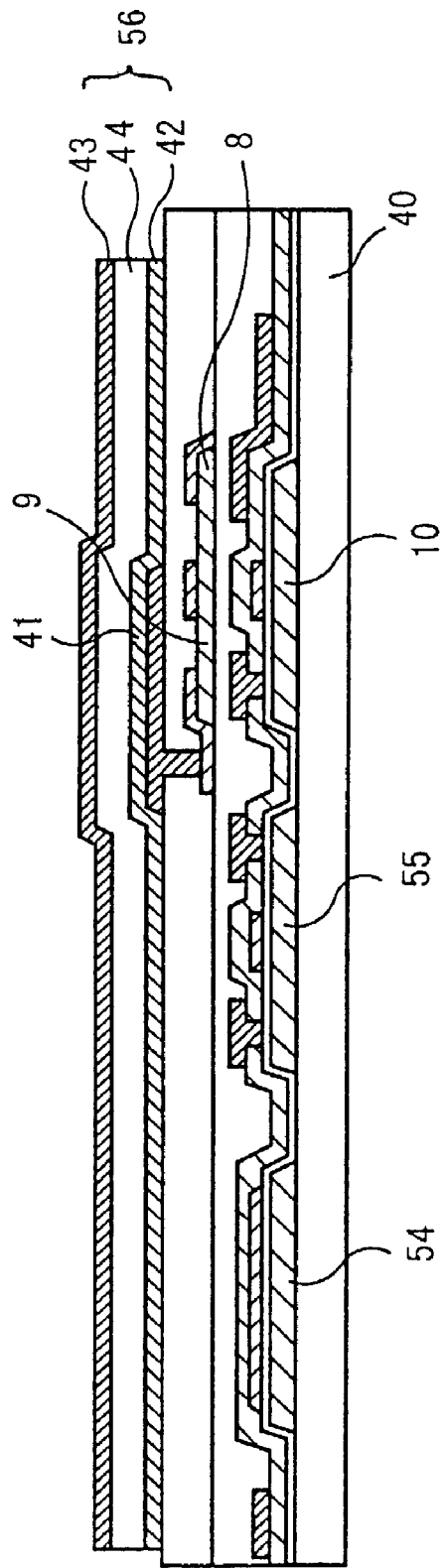
FIG. 3 is a sectional view showing the structure of the pixel driving circuit according to Embodiment 1 of the present invention.

FIG. 3 is a sectional view showing a pixel section according to Embodiment 1. In FIG. 3, 40 denotes a transparent insulating substrate, 41 denotes a shielding film, 42 denotes a hole injection layer, 43 denotes an electron injection layer, 44 denotes an light emission layer and 56 denotes an organic EL element.

In FIG. 3, the first transistor 53, the second transistor 55, the third transistor 10 and the capacitor 54 are formed on the transparent insulating substrate 40. An interlayer insulating film is formed, an amorphous silicon layer is formed thereon and an electrode is provided so that the photo-detecting element 8 and the resistor 9 are formed. By providing the shielding film 41 on only the resistor 9, the photo-detecting element 8 and the resistor 9 can be fabricated separately by the same amorphous silicon. Furthermore, the hole injection layer 42, the light emission layer 44 and the electron injection layer 43 are provided through the interlayer insulating film, thereby constituting the organic EL element 56. Consequently, it is possible to implement a spontaneous light emitting type display device having the organic EL element 56 and the photo-detecting element 8 in pairs.

Since the pixel driving circuit of the spontaneous light emitting type display device according to Embodiment 1 is constituted as described above, a voltage at which each pixel starts to be illuminated can be detected in advance by the photo-detecting element 8 and can be stored in the memory 25, and furthermore, a threshold voltage at which the organic EL element 56 starts to be illuminated can be added to a voltage corresponding to a luminance in order to accurately display a luminance required for each pixel. Consequently, it is possible to carry out the display with a desirable luminance without depending on a variation in the threshold of the second transistor 55.

Embodiment 2

Figure 4:
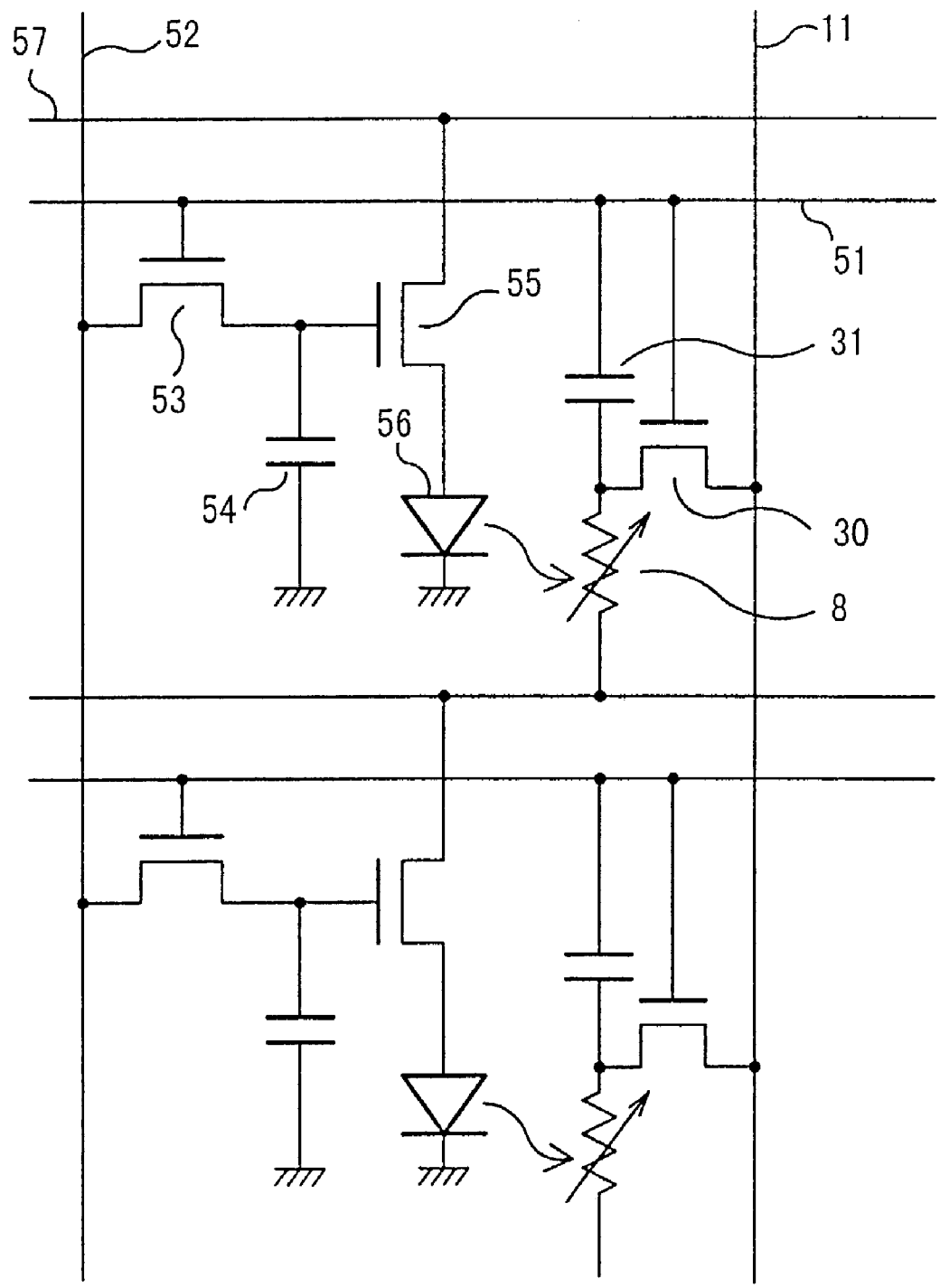
FIG. 4 is a circuit diagram showing the structure of a pixel driving circuit according to Embodiment 2 of the present invention.

FIG. 4 is a circuit diagram showing the pixel driving circuit of one pixel in a spontaneous light emitting type display device according to Embodiment 2 of the present invention. In FIG. 4, 51 denotes a first vertical scanning line, 52 denotes a first horizontal scanning line, 53 denotes a first transistor, 54 denotes a capacitor, 55 denotes a second transistor, 56 denotes an organic EL element, and 57 denotes a power line. While one of the ends of the capacitor 54 and the cathode side of the organic EL element 56 are grounded, it is preferable that they should have a fixed potential. Moreover, 8 denotes a photo-detecting element, 11 denotes a second horizontal scanning line, 30 denotes a fourth transistor, and 31 denotes a second capacitor. In the present embodiment, one of the terminals of the photo-detecting element 8 is connected to the power line 57 and the other terminal is connected to the first vertical scanning line 51 through the second capacitor 31. The fourth transistor 30 has a gate terminal connected to the first vertical scanning line 51 and is controlled by the first vertical scanning line 51, and furthermore, a source terminal is connected to the node of the photo-detecting element 8 and the second capacitor, and the electric potential of the node in the photo-detecting element 8 and the second capacitor is given to the second horizontal scanning line 11 during conduction. The drain terminal of the fourth transistor 30 is connected to the second horizontal scanning line.

Next, an operation will be described.

In Embodiment 2, an electric circuit is constituted as described above. Therefore, when the first vertical scanning line 51 is activated, both the first transistor 53 and the fourth transistor 30 are brought into a conduction state. Data are written from the first horizontal scanning line 52 to the capacitor 54. When the voltage value of the data does not reach a voltage at which the second transistor 55 can be conducted, that is, the threshold voltage of the second transistor 55, the organic EL element 56 does not emit light. Therefore, the photo-detecting element 8 is maintained to have a high resistance. For an electric potential at the node of the photo-detecting element 8 and the second capacitor, a voltage led from the electric potential of the power line 57 corresponding to the activated voltage of the first vertical scanning line 51 is supplied to the second horizontal scanning line 11 through the fourth transistor 30. On the other hand, when the voltage of the data supplied from the first horizontal scanning line 52 reaches a voltage at which the second transistor 55 can be conducted, a current is supplied to the organic EL element 56 so that the organic EL element 56 emits light. When the photo-detecting element 8 detects the light, the resistance value of the photo-detecting element 8 is reduced so that the electric potential of the power line 57 is almost supplied to the second horizontal scanning line 11 through the fourth transistor 30.

Thus, the threshold voltage of the second transistor 55 can be detected by the voltage of the data to be given to the first horizontal scanning line 52, thus, the voltage can be stored in the memory 25 and a threshold voltage at which the organic EL element 56 starts to be illuminated can be applied to a voltage corresponding to a luminance in order to accurately display a luminance required for each pixel in the same manner as that in Embodiment 1. Consequently, it is possible to carry out the display at a desirable luminance without depending on a variation in the threshold of the second transistor 55.

Embodiment 3

Figure 5:
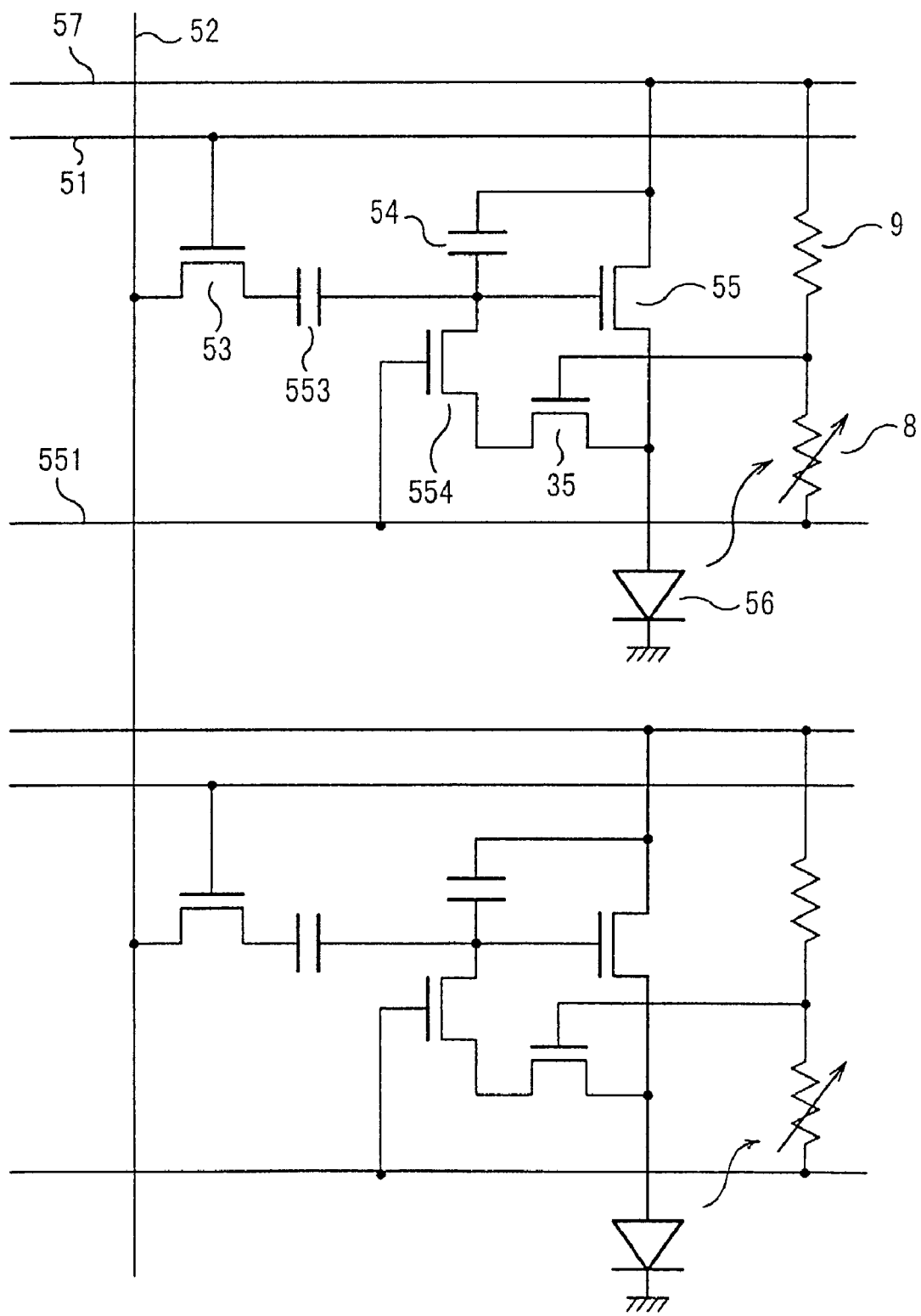
FIG. 5 is a circuit diagram showing the structure of a pixel driving circuit according to Embodiment 3 of the present invention.

FIG. 5 is a circuit diagram showing the pixel driving circuit of one pixel in a spontaneous light emitting type display device according to Embodiment 3 of the present invention. In FIG. 5, 51 denotes a first vertical scanning line, 52 denotes a first horizontal scanning line, 53 denotes a first transistor, 54 denotes a capacitor, 55 denotes a second transistor, and 56 denotes an organic EL element. 57 denotes a power line, 8 denotes a photo-detecting element, and 9 denotes a resistor. Moreover, 551 denotes a second vertical scanning line for correction, 553 denotes an auxiliary third capacitor, 554 denotes a fifth transistor for correction, and 35 denotes a sixth transistor. While the cathode side of the organic EL element 56 is grounded, it preferably has a fixed potential.

Since the structure of a lower half in the drawing is a structure in a next stage and is the same as that of an upper half, description thereof will be omitted. Moreover, the pixel driving circuit is arranged in a matrix and a structure thereof is the same as that of the conventional art, and description thereof will be thereby omitted.

Figure 6:
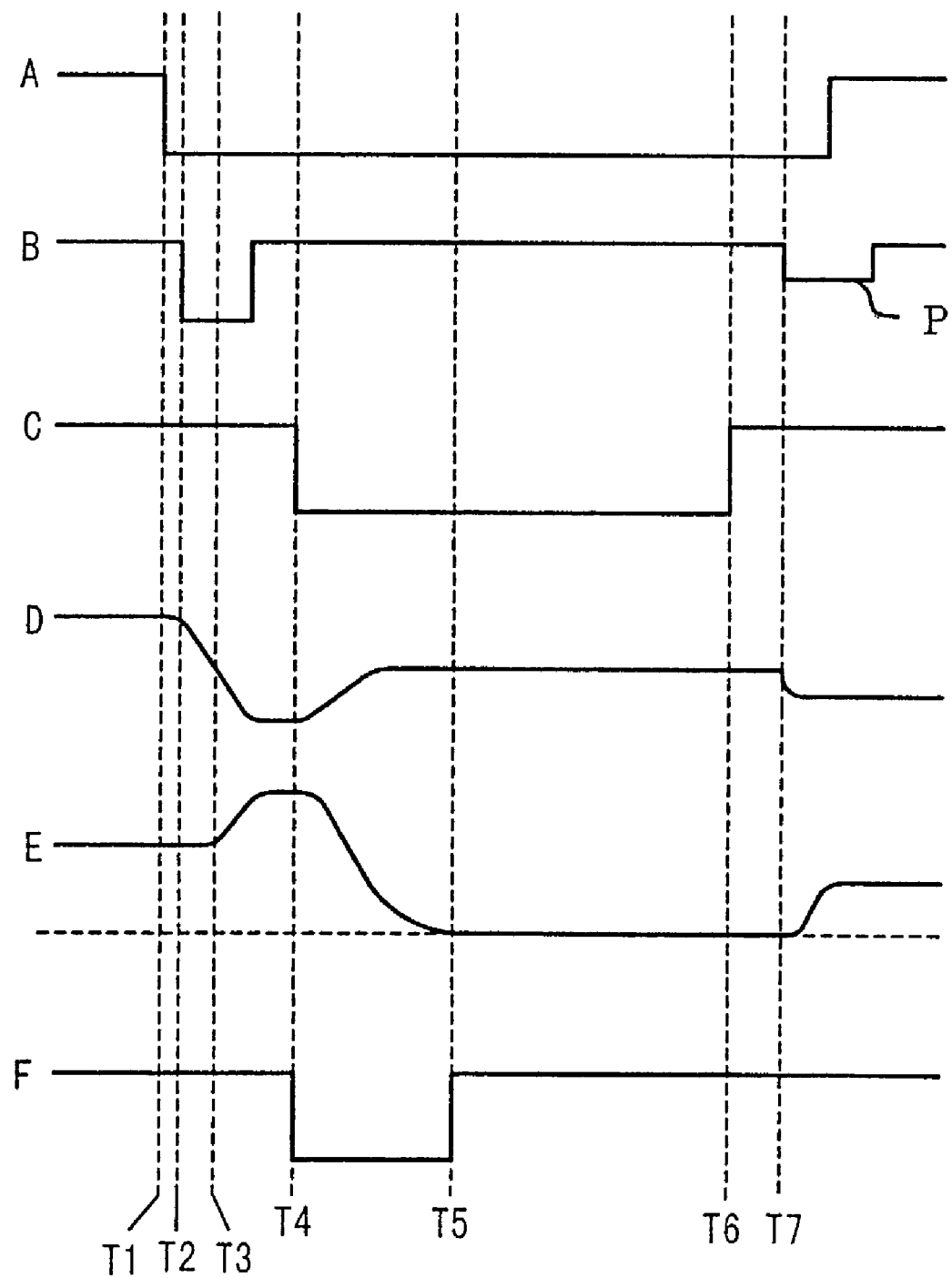
FIG. 6 is a waveform diagram showing the operation sequence of the pixel driving circuit according to Embodiment 3 of the present invention.
Figure 7:
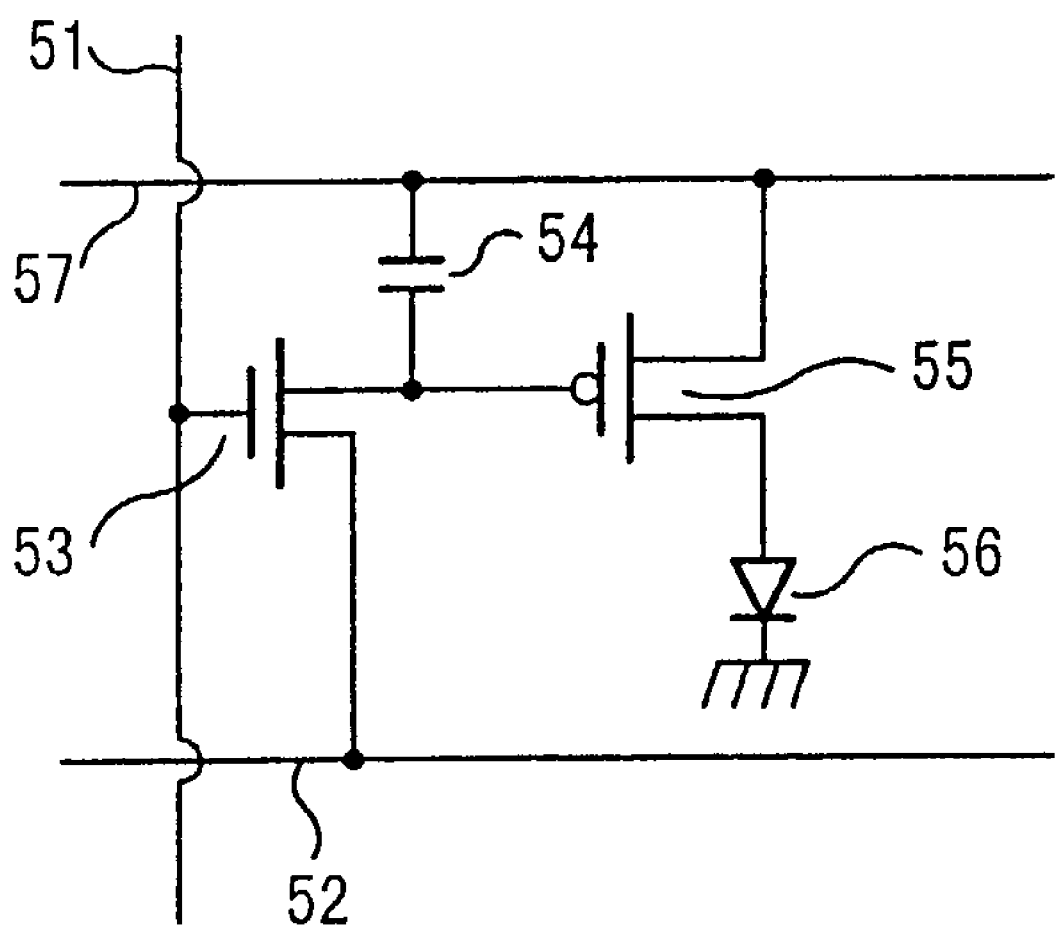
FIG. 7 is a circuit diagram showing the structure of a pixel driving circuit in a conventional spontaneous light emitting display device.
Figure 8:
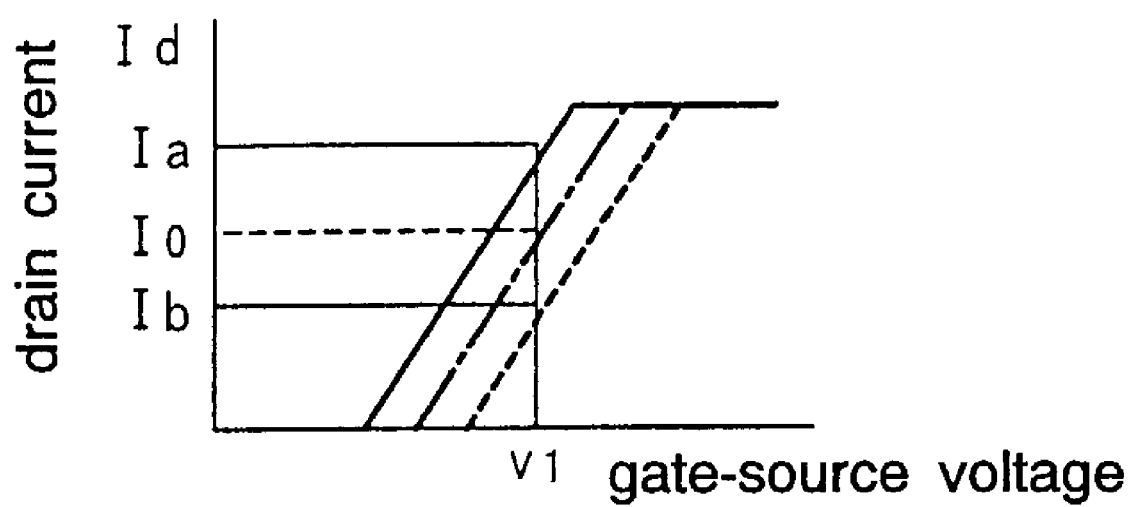
FIG. 8 is a characteristic chart for explaining the operation of the conventional spontaneous light emitting display device.
Figure 9:
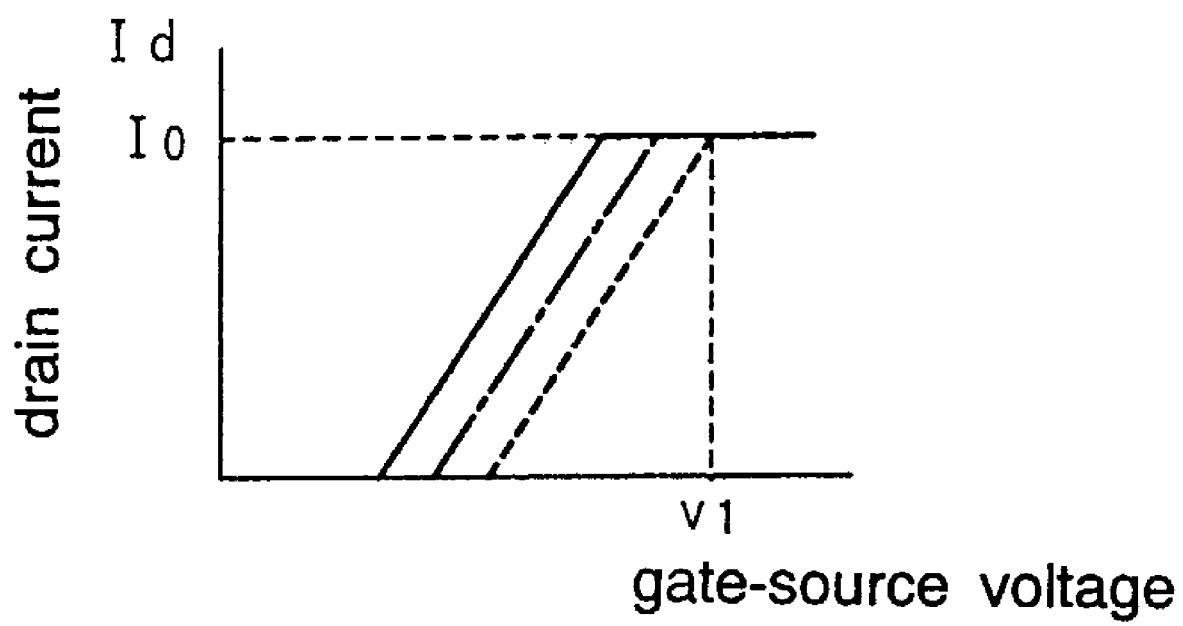
FIG. 9 is a characteristic chart for explaining the operation of the conventional spontaneous light emitting display device.
Figure 10:
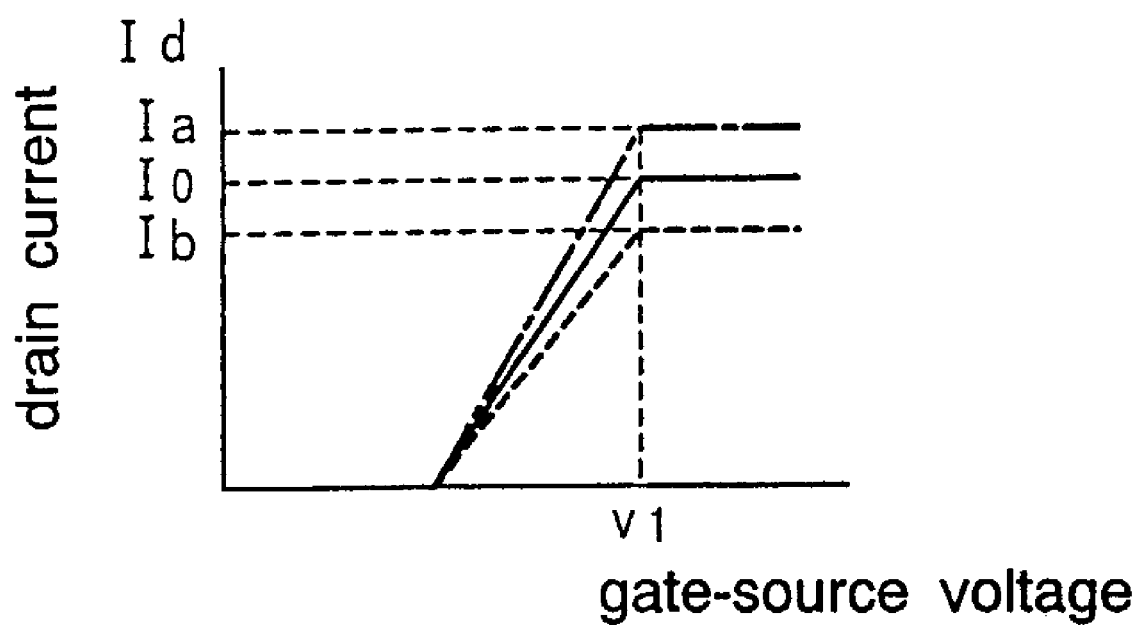
FIG. 10 is a characteristic chart for explaining the operation of the conventional spontaneous light emitting display device.
Figure 11:
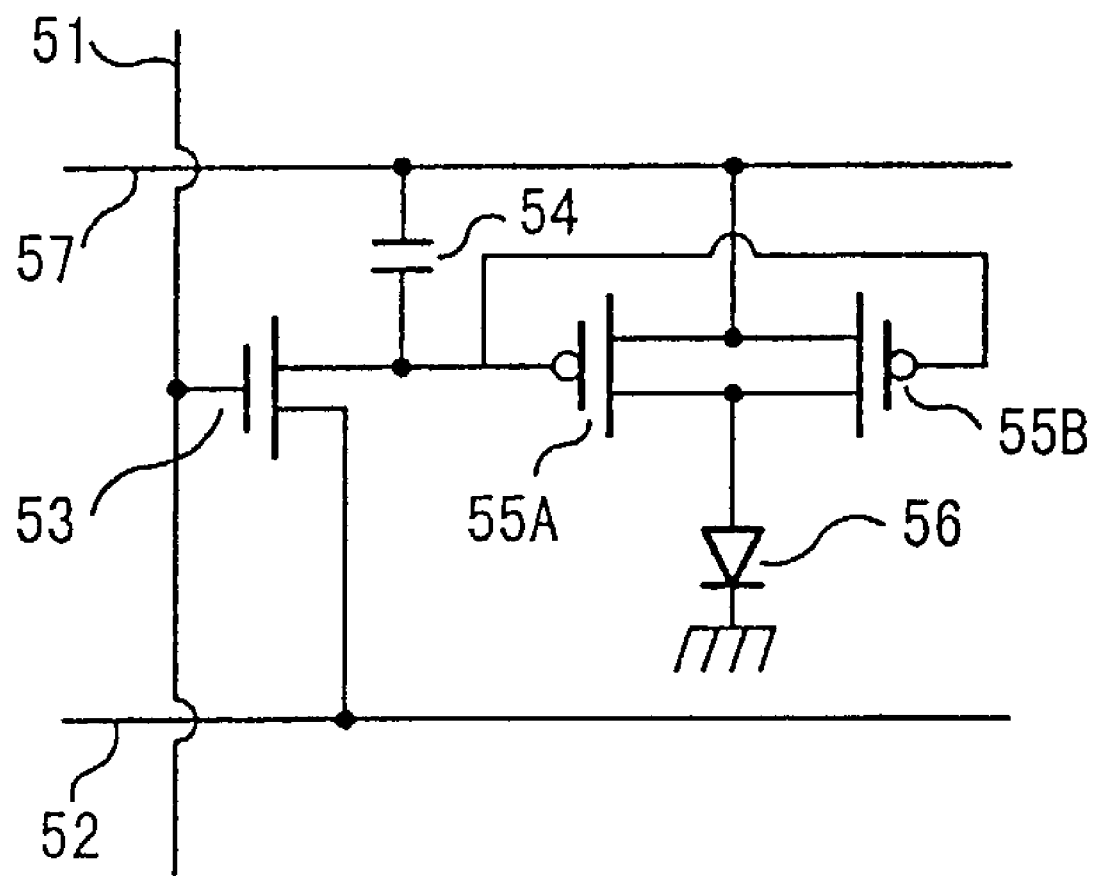
FIG. 11 is a circuit diagram showing a pixel driving circuit in another conventional spontaneous light emitting display device.
Figure 12:
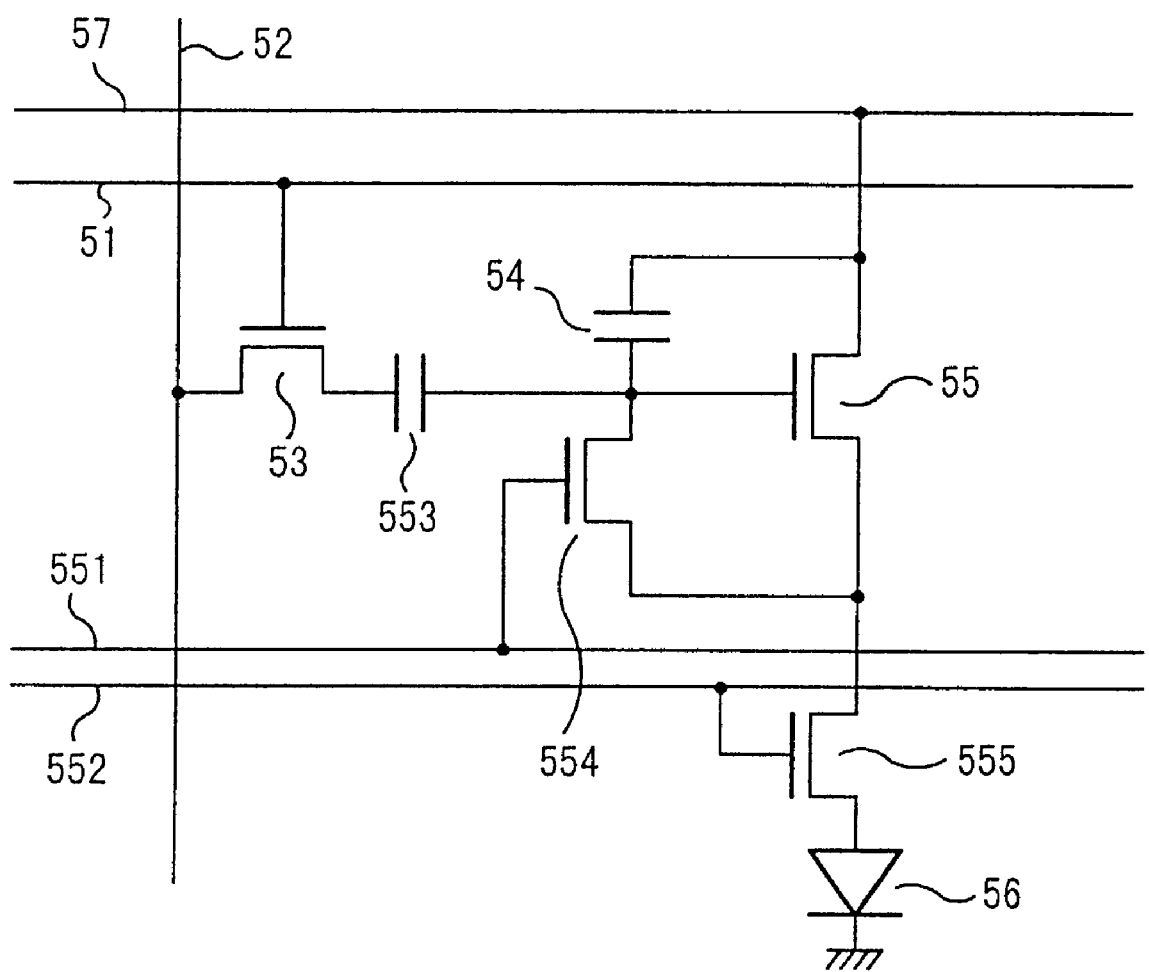
FIG. 12 is a circuit diagram showing a pixel driving circuit in a further conventional spontaneous light emitting display device.
Figure 13:
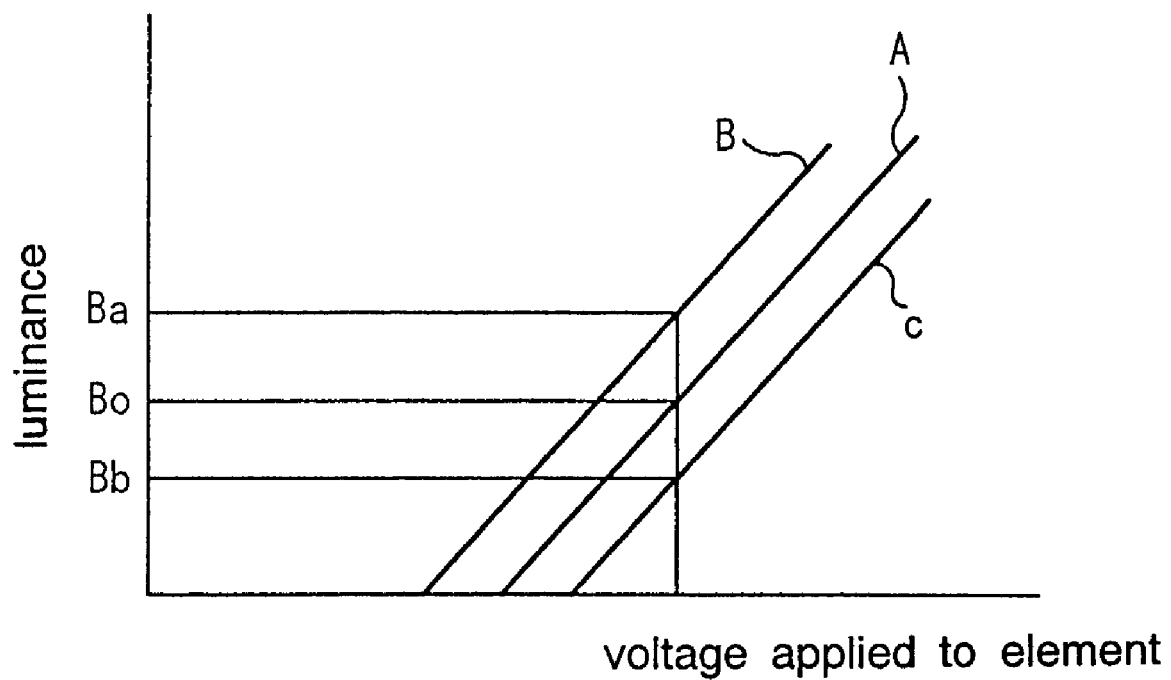
FIG. 13 is a characteristic chart for explaining the operation of the conventional spontaneous light emitting display device.

Next, an operation will be described with reference to a waveform diagram of FIG. 6. In FIG. 6, a waveform A denotes a first vertical scanning signal, a waveform B denotes a first horizontal scanning signal, a waveform C denotes a vertical scanning signal for correction, a waveform D denotes a gate voltage of the second transistor, a waveform E denotes a light emission intensity of the organic EL element, and a waveform F denotes a voltage of a node Z.

In a timing T1 of FIG. 6, the first vertical scanning line 51 is activated based on the first vertical scanning line signal indicated as the waveform A so that the first transistor 53 is conducted. In a timing T2 of FIG. 6, the first horizontal scanning line signal (waveform B) with which the second transistor 55 is sufficiently conducted is input from the first horizontal scanning line 52 to the capacitor 54 through the first transistor 53 and the auxiliary third capacitor 553. As a result, the charging voltage of the capacitor 54, that is, the gate-source voltage (waveform D) of the second transistor 55 is increased so that the resistance of the second transistor 55 is reduced. Correspondingly, a voltage to be applied to both ends of the organic EL element 56 is increased and is set to sufficiently exceed a threshold voltage at which the organic EL element 56 is conducted. Consequently, a current flows from the power line 57 through the second transistor 55 and the organic EL element 56, and the organic EL element 56 emits light (waveform E) in a timing T3 of FIG. 6. The emitted light is incident on the photo-detecting element 8. Therefore, the resistance value of the photo-detecting element 8 is decreased by the light so that the gate potential of the sixth transistor 35, that is, the node Z in FIG. 5 is set to have an equal electric potential to the electric potential of the vertical scanning line 551 for correction. Thus, the sixth transistor 35 is controlled by the vertical scanning line 551 for correction.

In a timing T4 of FIG. 6, when the vertical scanning line 551 for correction is activated in response to the vertical scanning line signal for correction (waveform C), the fifth transistor 554 for correction and the six transistor 35 are conducted at the same time. Consequently, a closed circuit is formed by the capacitor 54, the second transistor 55, the fifth transistor 554 for correction and the sixth transistor 35. The closed circuit forms the discharge circuit of the capacitor 54. Therefore, the voltage of the capacitor 54, that is, the gate-source voltage of the second transistor 55 (waveform D) is dropped. Accordingly, when the resistance value of the second transistor 55 is increased again, the value of a current flowing to the organic EL element 56 is reduced and a voltage to be applied to both ends of the organic EL element 56 is dropped. When the voltage value becomes smaller than the threshold voltage of the organic EL element 56, the current finally stops flowing to the organic EL element 56. In a timing T5 of FIG. 6, the light emission of the organic EL element 56 is stopped as shown in the waveform E.

When the light emission of the organic EL element 56 is stopped, the resistance value of the photo-detecting element 8 is increased. Consequently, the node Z is set to have an equal electric potential to that of the power line 57 and the sixth transistor 35 is non-conducted (waveform F). Consequently, the closed circuit formed by the capacitor 54, the second transistor 55, the fifth transistor 554 for correction and the sixth transistor 35 is opened so that the discharge of the capacitor 54 is stopped, and finally, an equal electric potential to the gate-source voltage which is required for causing a current to flow from the power line 57 to a circuit having the second transistor 55 and the organic EL element 56 connected in series is stored and maintained in the capacitor 54.

A voltage stored in the capacitor 54 is held until the activation is carried out by the first vertical scanning line 51 as a next frame.

In a timing T6 of FIG. 6, next, the fifth transistor 554 for correction is non-conducted by the vertical scanning line 551 for correction and a data signal (P) corresponding to a luminance required for the organic EL element 56 is then added through the first horizontal scanning line 52 in a timing T7 of FIG. 6. Consequently, both the threshold voltage of the second transistor 55 and that of the organic EL element 56 can be corrected and a variation in the luminance of the organic EL element 56 can be suppressed. The voltage stored in the capacitor 54 is held until the activation is carried out by the first vertical scanning line 51 as a next frame.

While the operation of the pixel driving circuit has been described for one pixel, the same operation is carried out for each pixel arranged in a matrix. Thus, it is possible to implement a spontaneous light emission type display device having no variation in luminance in a whole screen.

While all the transistors of a P type have been described in the above circuit structure, the present invention is not restricted to the P type.

Moreover, while the organic EL element has been used as a light emitting element to be a display element in the above description, an inorganic EL element or the like might be used for the light emitting element and the present invention is not restricted to the organic EL element.

INDUSTRIAL APPLICABILITY

The present invention can suppress a variation in the threshold voltage of a transistor for controlling the current of a light emitting element and a variation in the light emission threshold voltage of the light emitting element, and can thereby suppress a variation in the luminance of the light emitting element and can be utilized effectively for a spontaneous light emitting type display device.

The invention claimed is:

1. A spontaneous light-emitting display device comprising:
   a vertical scanning line, first and second horizontal scanning lines, and a power line corresponding to the vertical scanning line,
   a first transistor proximate an intersection of the vertical scanning line and the first horizontal scanning line and controlled by potential on the vertical scanning line,
   a capacitor connected to the first horizontal scanning line through the first transistor, a second transistor connected to the first horizontal scanning line through the first transistor and controlled by potential on the first horizontal scanning line, a light-emitting element connected to the power line through the second transistor, a light-detecting element and a resistor connected in series between the vertical scanning line and the power line, and a third transistor having a control terminal at an electrical potential of a node of the light-detecting element and the resistor, wherein the power line is connected to the second horizontal scanning line through the third transistor, and the light-detecting element detects light emitted by the light-emitting element.

2. The spontaneous light emitting display device of claim 1, wherein the device includes a control circuit for reading a signal from the light-detecting element through the second horizontal scanning line, a memory for storing a signal for each light-emitting element as data, and means for modulating a signal voltage to be applied to the light-emitting element based on the data stored in the memory and applying the signal voltage thus modulated to the first horizontal scanning line.

3. The spontaneous light-emitting display device of claim 1, wherein the light-detecting element is amorphous silicon.

4. The spontaneous light-emitting display device of claim 1, wherein both the light-detecting element and the resistor are amorphous silicon and including a shielding film between the resistor and the light-emitting element.

5. The spontaneous light-emitting display device of claim 2, wherein the light-detecting element is amorphous silicon.

6. A spontaneous light-emitting display device comprising:

a vertical scanning line, first and second horizontal scanning lines, and a power line corresponding to the vertical scanning line, a first transistor proximate an intersection of the vertical scanning line and the first horizontal scanning line and controlled by potential on the vertical scanning line, a first capacitor connected to the first horizontal scanning line through the first transistor and connected to ground, a second transistor connected to the first horizontal scanning line through the first transistor and controlled by potential on the first horizontal scanning line, a light-emitting element connected to the power line through the second transistor, a third transistor controlled by the potential on the vertical scanning line, a second capacitor, and a light-detecting element wherein, the light-detecting element and the second capacitor are connected in series between the vertical scanning line and the power line, a node of the light-detecting element and the second capacitor is connected to the second horizontal scanning line through the third transistor, and the light-detecting element detects light emitted by the light-emitting element.

7. The spontaneous light-emitting display device of claim 6, wherein the device includes a control circuit for reading a signal of the light-detecting element through the second horizontal scanning line, a memory for storing a signal for each light-emitting element as data, and means for modulating a signal voltage to be applied to the light-emitting element based on the data stored in the memory and applying the signal voltage thus modulated to the first horizontal scanning line.

8. The spontaneous light-emitting display device of claim 6, wherein the light-detecting element is amorphous silicon.

9. A spontaneous light-emitting display device comprising:

a first and second vertical scanning lines, a first horizontal scanning line, and a power line corresponding to the first and second vertical scanning lines, a first transistor proximate an intersection of the first vertical scanning line and the horizontal scanning line and controlled by potential on the first vertical scanning line, first and second capacitors, the first capacitor being connected to the horizontal scanning line through the first transistor and the second capacitor, a second transistor connected to the horizontal scanning line through the first transistor and the second capacitor and controlled by potential on the horizontal scanning line, a light-emitting element connected to the power line through the second transistor, a third transistor controlled by potential on the second vertical scanning line, a fourth transistor, the third and fourth transistors being connected in series between a control terminal of the second transistor and the light- emitting element, and a light-detecting element and a resistor connected in series between the second vertical scanning line and the power line, wherein a node of the light-detecting element and the resistor is connected to a control terminal of the fourth transistor, and the light-detecting element detects light emitted by the light-emitting element.

10. The spontaneous light-emitting display device of claim 9, wherein both the light-detecting element and the resistor are amorphous silicon and including a shielding film between the resistor and the light-emitting element.

11. The spontaneous light-emitting display device of claim 9, wherein the light-detecting element is amorphous silicon.

* * * * *